Nov. 5, 1957 W. H. BUDD 2,812,400

COMBINATION SWITCH AND VARIABLE RESISTOR
ADAPTED FOR USE WITH PRINTED WIRING

Original Filed Dec. 4, 1953 4 Sheets-Sheet 1

Inventor
Wilbert H. Budd
By Ira Milton Jones
Attorney

Inventor
Wilbert H. Budd
By Ira Milton Jones
Attorney

Inventor
Wilbert H. Budd
By Ira Milton Jones
Attorney

Inventor
Wilbert H. Budd
By Ira Milton Jones
Attorney

United States Patent Office 2,812,400
Patented Nov. 5, 1957

2,812,400

COMBINATION SWITCH AND VARIABLE RESISTOR ADAPTED FOR USE WITH PRINTED WIRING

Wilbert H. Budd, Elkhart, Ind., assignor to Chicago Telephone Supply Corporation, Elkhart, Ind., a corporation of Indiana Original application December 4, 1953, Serial No. 396,295. Divided and this application October 3, 1956, Serial No. 613,685

7 Claims. (Cl. 200—67)

This invention, like that of the copending application, Serial No. 396,295, filed December 4, 1953, of which this is a division, relates to a combination switch and variable resistor of the type commonly used in radio receivers, and has as its general purpose to provide a combined switch and variable resistor or volume control especially adapted for use with printed circuits. With printed circuitry the wiring by which the various components of the receiver are connected into their circuits is printed upon one face of a panel of suitable insulating material. The material used for the printing of this wiring, of course, must have a high coefficient of conductivity. Electrolytic copper has been found to be quite satisfactory.

The advantages of printed circuits, or prefabricated wiring as it is often called are numerous, especially for small portable receivers where space is at a premium and cost is an exceptionally important factor. More and more manufacturers of radio receivers are, therefore, adopting printed wiring, but since past methods of connecting the components of a receiver into their respective circuits are not adapted to this new wiring technique, its adoption has presented the manufacture of the various components with a serious problem. This problem was especially perplexing where the switch and a variable resistor, often the volume control, are combined in a single composite unit to be controlled by one shaft. For the variable resistor alone, suitable terminals could be easily provided to project forwardly in the general direction of the control shaft so as to extend through openings in the panel upon which the wiring is printed and be soldered to their respective leads.

However, where switches are combined with and mounted upon a back of a variable resistor, the design found most acceptable through years of experience, it was impracticable to resort to the obvious expedient of merely lengthening the switch terminals and bending them so as to project forwardly far enough to reach through the panel upon which the wiring is printed. Such a construction would be highly impractical since it would require a very special terminal with a number of bends in it to clear the switch and control covers and so constructed it would lack the necessary mechanical strength and be difficult to assemble with the panel due to the long unsupported length of the terminals.

This invention solves the problem in a novel and expeditious manner by the rather simple expedient of using a miniaturized variable resistor or control in a housing or casing designed for a full sized control and in mounting the resistor and a switch which is carried on the back of the control housing off center with respect to the housing. This enables the switch terminals to be brought forwardly directly through the housing and the base of the control, so that the switch terminals as well as the terminals of the variable resistor are supported by the base of the resistor and project directly therefrom.

An important object of this invention thus resides in the provision of a combined switch and variable resistor wherein the switch terminals as well as the terminals for the resistor lie wholly within the boundary of the base for the variable resistor, bearing in mind that, as is customary in such controls now in use, the terminals for the resistor are secured to and project from a terminal support which extends radially out from one edge of the base.

Another object of this invention is to provide a combined switch and variable resistor of the character described wherein the switch terminals are protected by being located within the switch and control housings, and have their outer end portions supported by and protruding from the base of the control. This arrangement possesses the advantage of holding all of the terminals in proper positional relationship with one another and thus facilitates assembly of the device upon a printed circuit panel.

Another object of this invention is to provide an improved stationary switch contact and terminal especially adapted for use in a combined switch and variable resistor designed for use with printed circuitry.

Still another object of this invention is to provide an improved switch construction which, though especially designed for incorporation in a combined control unit of the character described, has considerable advantage from the standpoint of a switch per se.

With the above and other objects in view, which will appear as the description proceeds, this invention resides in the novel construction, combination and arrangement of parts substantially as hereinafter described and more particularly defined by the appended claims, it being understood that such changes in the precise embodiment of the hereindisclosed invention may be made as come within the scope of the claims.

The accompanying drawings illustrate two complete examples of the physical embodiment of the invention constructed according to the best modes so far devised for the practical application of the principles thereof, and in which.

Figure 1:
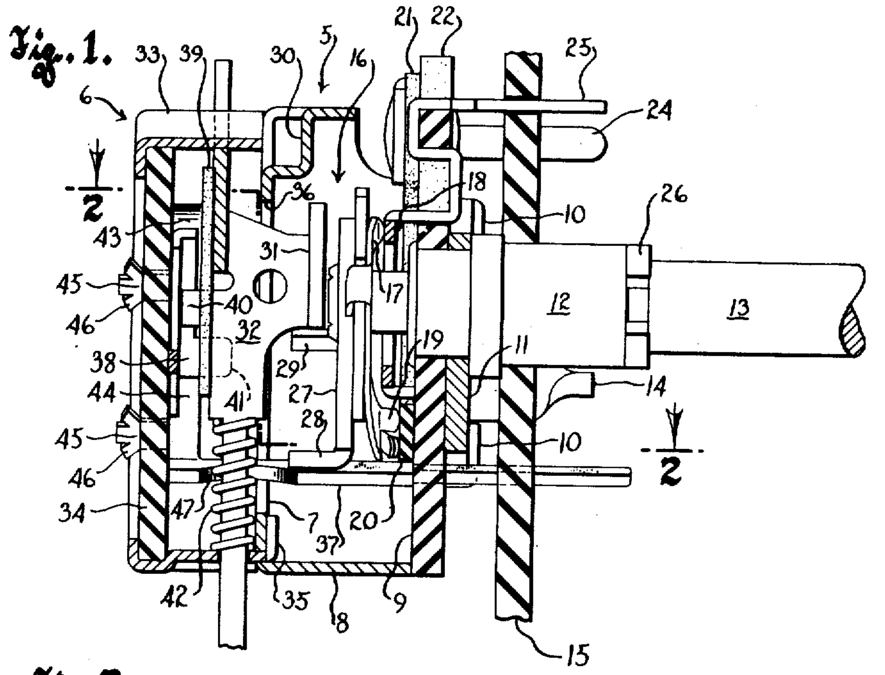
Figure 1 is a longitudinal sectional view through a combined switch and variable resistor embodying this invention and illustrating the same mounted upon a printed wiring panel.

Referring now more particularly to the accompanying drawings in which like numerals designate like parts throughout the several views, the numeral 5 designates generally a variable resistor or volume control of more or less conventional design, and the numeral 6 designates generally a switch of the type covered in U. S. Patent No. 2,660,651, issued November 24, 1953. These two components are mounted in tandem with the switch 6 secured to the back wall 7 of the cup-shaped cover or casing 8 for the volume control.

As is customary, the variable resistor or volume control has a base 9 of insulating material which coacts with the cover or casing 8 to house the mechanism of the volume control, the cover being secured to the base by ears 10 which extend from the front edge thereof and are clinched over the front face of a combined grounding and mounting plate 11 overlying the front of the base 9. This plate 11 has a bushing 12 thereon in which a control shaft 13 is journalled. It also has a pair of opposite mounting lugs 14 which are adapted to project through holes in a panel 15 upon which the entire instrument is mounted and be twisted to secure the instrument in place thereon.

The control shaft 13, as is customary, passes through the bushing 12 and through an appropriate opening in the base 9 to mount the rotating assembly 16 of the variable resistor or volume control. This rotating assembly 16 is of conventional construction and includes inner spring contact fingers 17 which ride upon a collector ring 18 and outer spring contact fingers 19 which ride upon a resistance element 20. The resistance element as is customary is substantially a flat ring, and is mounted upon the back or inner face of the base 9 concentrically to the shaft 13. Radially outwardly projecting end portions 21 on the resistance element overlie a radially outwardly projecting terminal support 22 integral with the base 9, and are clamped thereto by the attachment of the end terminals 24 of the variable resistor. These terminals project forwardly from the support 22 substantially perpendicularly therto.

The collector ring 18 has the center terminal 25 of the variable resistor formed integrally therewith and secured to the base 9 in the conventional manner to project forwardly from its terminal support 22 parallel with the end terminals 24 and the control shaft 13. Hence, when the instrument is mounted on the back of the panel 15 with the base 9, which constitutes the front wall of the device, in juxtaposition to the rear of the panel, the terminals 24 and 25 protrude through appropriate openings in the panel to enable the ends thereof to be soldered to the wiring (not shown) printed upon the front face of the panel.

The rearward thrust imposed upon the rotating assembly by the spring contact fingers 17 and 19 is carried by a conventional C washer 26 seated in a groove in the shaft and bearing against the front end of the bushing 12.

The rotating assembly includes a drive arm 27 from which a switch actuating lug 28 and a stop lug 29 project rearwardly. The latter co-acts with a stationary stop abutment 30 to define the limits of rotation of the rotating assembly. The switch actuating lug 28 co-acts with a cam 31 which forms part of a pitman-like switch actuator 32 to open the switch during the final degrees of retrograde rotation of the control shaft. The actuator is guided for reciprocation by having opposite end portions thereof slidably received in openings in the opposite side walls of a stamped metal cover or casing 33 which co-acts with a base 34 of insulating material to provide a cup-shaped housing for the switch.

The stamped metal casing 33 has the customary mounting ears 35 by which the switch is secured to the back wall of the volume control cover or casing 8, this wall having a relatively large substantially rectangular opening 36 to accommodate the portion of the actuator 32 which carries the cam 31, and also to permit the terminals 37 of the switch to project forwardly into and through the housing of the volume control. Since the specific construction of the switch in that embodiment of the invention illustrated in Figures 1 through 6, inclusive, forms no part of the invention, further detailed description thereof is deemed unnecessary. It is sufficient to point out that the contactor 38 which is like that of U. S. Patent No. 2,698,369, issued December 28, 1954, is confined between the inner face of the base 34 and a contact driver 39 is drivingly connected to the actuator 32 by means of a lug 40 and to the contactor 38 by lugs 41.

Consequently, a spring 42 reacting between a shoulder on the actuator and the side of the casing 33 yieldingly urges the contactor into bridging engagement with the stationary contacts 43 of the switch in the manner brought out at length in the aforesaid U. S. Patent No. 2,660,651.

Figures 3, 4, 5, 6:
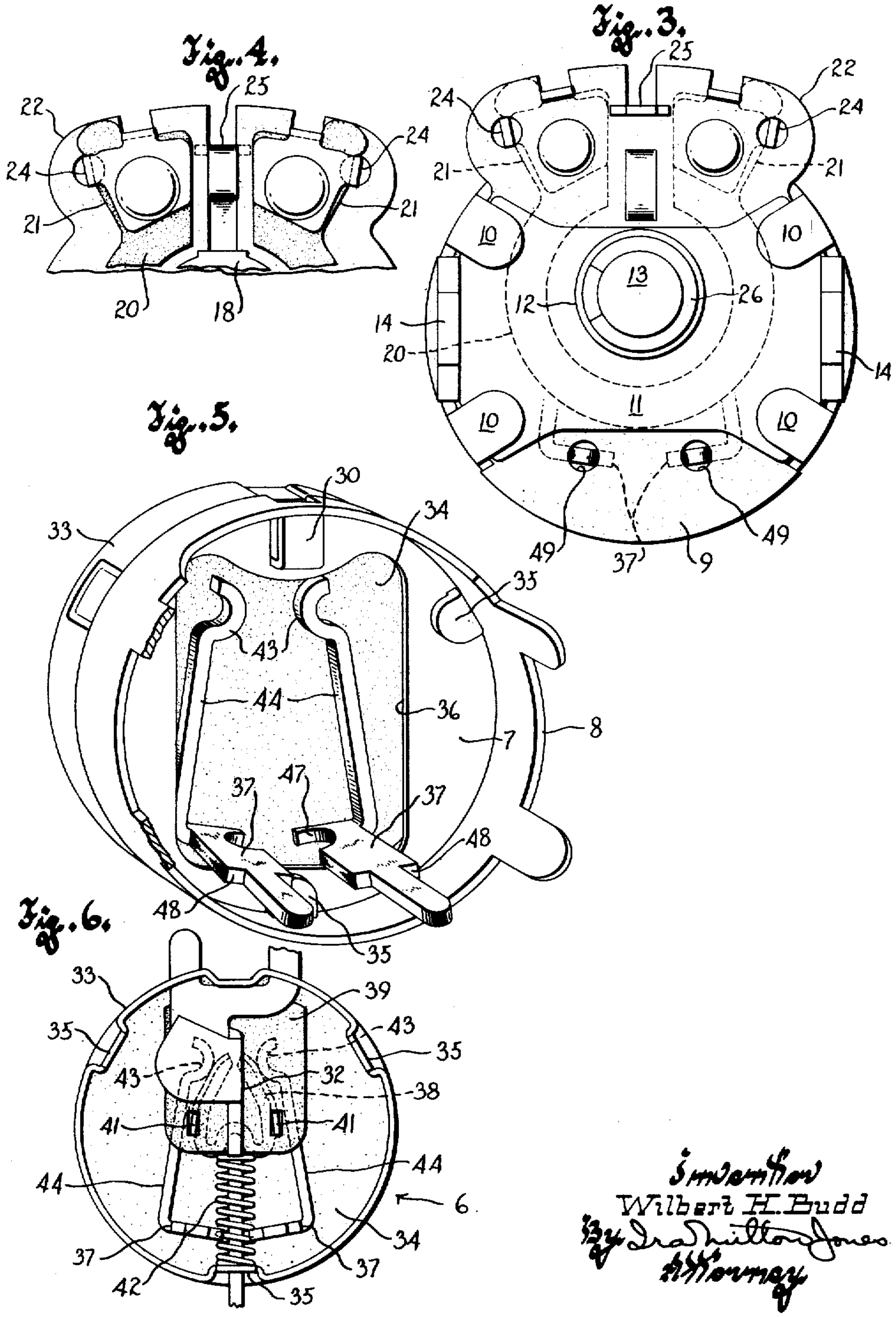
Figure 3 is a front view of the combined switch and volume control of this invention.
Figure 4 is a fragmentary detail view illustrating the rear or inside face of the terminal support of the variable resistor and showing the manner in which the ends of the resistance element and the terminals are secured in position thereon.
Figure 5 is a perspective view of the combined switch and volume control but with the switch contactor assembly and the mechanism of the variable resistor removed so as to better illustrate the manner in which the combined stationary switch contacts and terminals are arranged and pass through the housing of the resistor.
Figure 6 is a front view of the switch per se fully assembled.

Each stationary switch contact and its terminal is one integral substantially L-shaped sheet metal stamping having a foot portion 44 and a leg extending upwardly therefrom and providing the terminal 37. As best shown in Figure 5, the leg portion of the stamping is bent at substantially right angles to its foot portion and both of these parts of the stamping have one continuous coplanar bottom surface or edge which rests upon the base 34. Two spaced attaching ears 45 project down from the bottom of the foot portion 44 to pass through the base 34 and be split and staked over at the opposite side thereof as at 46.

The combined switch and terminal stampings are thus firmly anchored to the base with their terminal portions 37 near and substantially parallel with the adjacent side wall of the casing 33 and also the adjacent side wall of the casing 8. To accommodate the contact spring 42 and the portion of the pitman upon which it is mounted, the terminal portions are cut out as at 47. The actual contacts 43 are provided by what may be considered the toe portions of the stampings, and are curved to provide convex surfaces facing one another and perpendicular to the base, it being understood that the contactor 38 moves between and into engagement with these convex surfaces as the switch closes.

The outer end portions of the terminals 37 are reduced in width to provide abrupt shoulders 48 so spaced from the base 34 that when the parts are assembled with the narrow outer end portions of the terminals passing through holes 49 in the base 9, these shoulders bear against the inner face of the base 9. The switch terminals are thus firmly held against displacement from their correct positional relationship with the control shaft and the terminals 24 and 25 of the volume control. Consequently, during mounting of the instrument upon the panel 15 all of the terminals will align with their respective holes in the panel.

It is to be understood that when the instrument is thus assembled with the panel its attaching ears 14 are twisted to hold the instrument thereon. Thereafter, all of the terminals may be easily soldered to their respective leads or wires printed on the front face of the panel, by any one of the various methods employed by the different manufacturers to effect such soldering.

It is to be observed that by virtue of the off center position of the control and switch with respect to their respective housings, space is afforded within the housings and particularly within the control housing to accommodate the switch terminals, it being understood that the switch terminals lie outside the periphery of the circular resistance element 20 where maximum space obtains between the resistance element and the adjacent wall of the cover 8. In other words, the parts are so arranged that the switch terminals 37 are equispaced from the plane of maximum eccentricity.

In that form of the invention illustrated in Figures 7 to 10 inclusive, the switch embodies certain features which adapt it particularly well to this invention. Thus, instead of the stamped and formed combination terminal and contact of the previously described form of the invention, the stationary switch contacts 50 and their terminals 51 are provided by cylindrical pins or posts, the contacts consisting merely of cylindrical flanges thereon so located as to seat upon the base when the mounting end of the pin or post protrudes through the base the correct distance to be rolled over or riveted. This construction has the advantage of adapting the combined contact and terminal to automatic feeding apparatus and thus achieves an assembly cost reduction. It also achieves exceptional stability for the mounting and assures that the terminals will project straight out from the switch base to pass through relatively small holes 52 in the back wall 53 of the metal cover or casing for the volume control, and through close fitting holes in the base 9 of the volume control.

Figure 9:
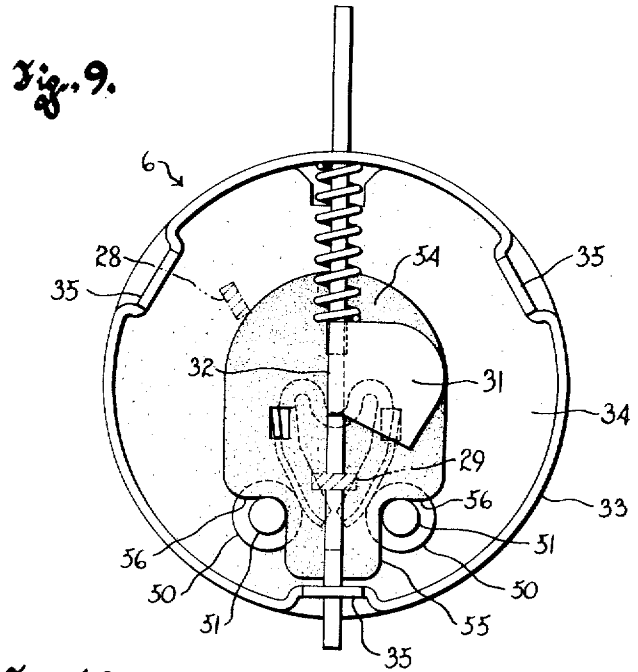
Figure 9 is a front view looking into the switch of Figures 7 and 8, and illustrating the same in its closed condition.
Figure 10:
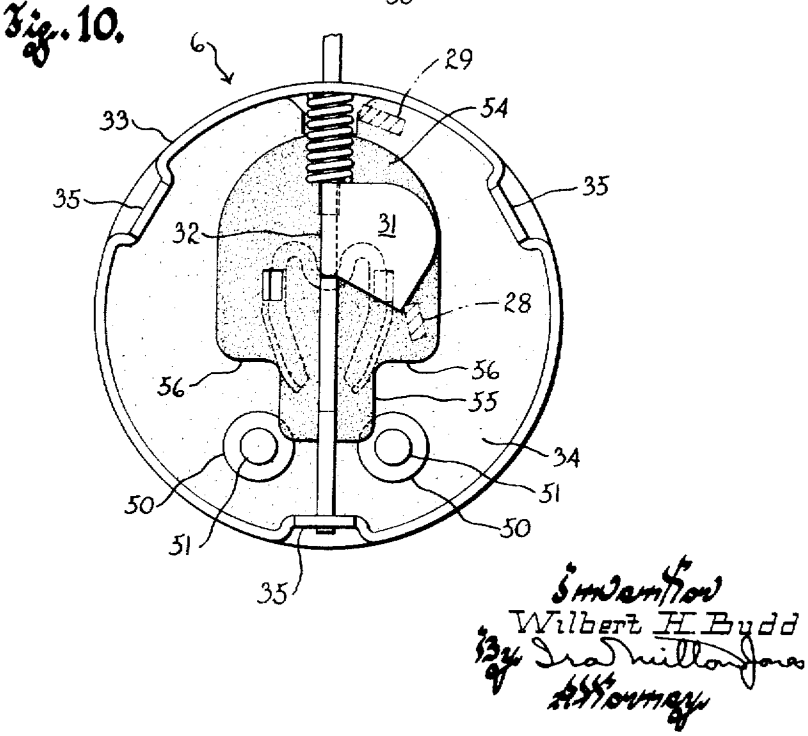
Figure 10 is a view similar to Figure 9 but showing the switch in its open condition.

This modified switch construction simplifies the guiding of the insulated contact driver 54 by utilizing the terminals to guide the same. To this end, the driver 54 has a tongue 55 projecting therefrom to move between the terminals as best shown in Figure 9. Shoulders 56 on the driver at the base of this tongue engage the terminals 51 to limit the spring produced movement of the contact assembly and thereby preclude excessive deflection of the contactor arms. Retraction of the contact assembly is of course, effected in the same manner as hereinbefore described, namely, by the drive lug 28 riding onto the cam 31.

From the foregoing description taken in connection with the accompanying drawings, it will be readily apparent to those skilled in this art that this invention solves the problem of adapting a combined switch and volume control to use with printed circuitry, and that the manner in which this objective is attained by this invention results in a highly practical and easily mounted instrument.

What is claimed as my invention is:

1. An electric switch comprising: a cup-like housing having a cylindrical side wall and an end wall of insulating material closing one end of the housing and providing a base for the switch, the other end of the housing being open; a movable contactor wholly within the housing and constrained to movement across the inner face of the base; actuating means for the movable contactor, inside the housing but accessible for manipulation through the open end of the housing; stationary contacts fixed on the switch base inside the housing to be engaged by the movable contactor; and terminals carried by the base and electrically connected with the stationary contacts, said terminals being positioned wholly inwardly of the periphery of the base and projecting from the base towards and through and beyond the open end of the housing to pass through appropriately located holes in a wall upon one side of which the switch may be mounted with said wall closing the open end of the housing, and thus provide for connecting the switch with conductors at the other side of said wall.

2. The switch of claim 1 wherein said terminals are cylindrical posts and the stationary contacts are flanges on said posts, and wherein said posts are fixed to the switch base by having their portions inwardly of the flanges passing through the base and rolled over the opposite face thereof to thereby clamp the flanges against the base.

3. A combined contact and terminal unit for an electric switch, comprising: a substantially L-shaped sheet metal stamping providing an elongated foot having a flat bottom surface engageable with a switch base, and an elongated leg extending up from one end portion of said foot substantially perpendicular to its flat bottom surface, said leg providing a terminal; a contact portion at the other end of said foot having a contact surface substantially normal to said flat bottom surface; and attaching lugs on said foot extending downwardly therefrom substantially perpendicularly to said surface, for securing said foot to a switch base.

4. The combined contact and terminal unit set forth in claim 3 wherein said end portion of the foot from which the terminal projects is disposed at an acute angle to the foot and has a surface thereon coplanar with said flat bottom surface on the foot to increase the stability of the unit upon securement thereof to a switch base.

5. A combined stationary contact and terminal unit for an electric switch, comprising: a substantially L-shaped sheet metal stamping having an elongated mounting member and an elongated leg providing a terminal integrally joined to one end portion of the mounting member and extending generally perpendicularly therefrom, said mounting member having flat parallel sides and opposite longitudinal edges substantially normal to said sides and from one of which edges the terminal projects; means on the mounting member remote from the terminal providing a contact portion having a contact surface substantially normal to the edges of the mounting member; and lugs spaced along the length of said mounting member and projecting from the other edge thereof, in the plane of the sides of the mounting member, for attaching the combined contact and terminal unit to a switch base.

6. The combined stationary contact and terminal unit set forth in claim 5 wherein said end portion of the mounting member from which the terminal projects is bent flatwise out of the plane of the mounting member sides at an abrupt angle thereto to steady the mounting member on the base.

7. In an electric switch of the character described: a flat base of insulating material; a pair of stationary contacts on said base and having opposing contact surfaces projecting up from said base substantially perpendicularly thereto; terminals for said contacts projecting upwardly therefrom; a bridging contactor slidable across the base to and from bridging engagement with said opposing surfaces of the stationary contacts; an insulated driver for the contactor overlying the same and having driving engagement with the contactor; an actuator for the driver constrained to linear motion along a path parallel to the flat base and intersecting the space between the opposing contact surfaces; a loose driving connection between the actuator and the driver; and a projection on the driver having sliding engagement with the terminals so that the motion of the contactor assembly is guided jointly by the driving connection between the actuator and the insulated driver and the movement of the projection on the driver between the terminals.

References Cited in the file of this patent

UNITED STATES PATENTS

| | | |
|---|---|---|
| 1,999,019 | Hall et al. | Apr. 23, 1935 |
| 2,160,142 | Hathorn | May 30, 1939 |
| 2,264,955 | Schellenger | Dec. 2, 1941 |
| 2,612,577 | Jacobi | Sept. 30, 1952 |
| 2,698,369 | Dailey et al. | Dec. 28, 1954 |
| 2,717,943 | Dailey et al. | Sept. 13, 1955 |

UNITED STATES PATENT OFFICE

CERTIFICATE OF CORRECTION

Patent No. 2,812,400 November 5, 1957

Wilbert H. Budd

It is hereby certified that error appears in the above numbered patent requiring correction and that the said Letters Patent should read as corrected below.

Figure 2:
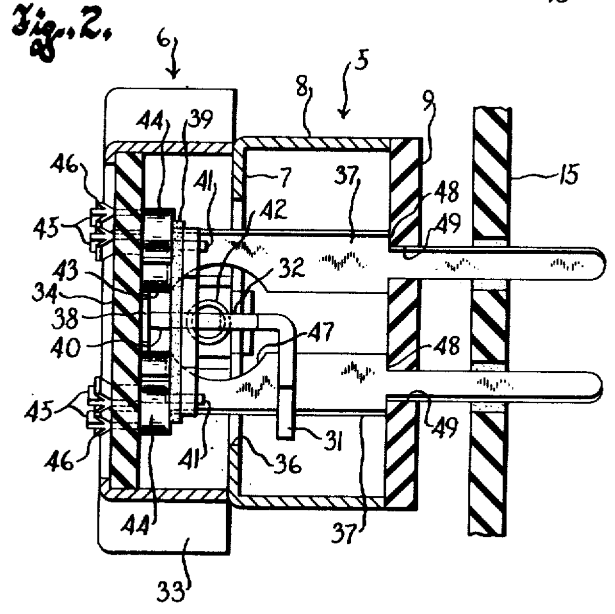
Figure 2 is a sectional view taken through Figure 1 on the planes of line 2—2.
Figures 7, 8:
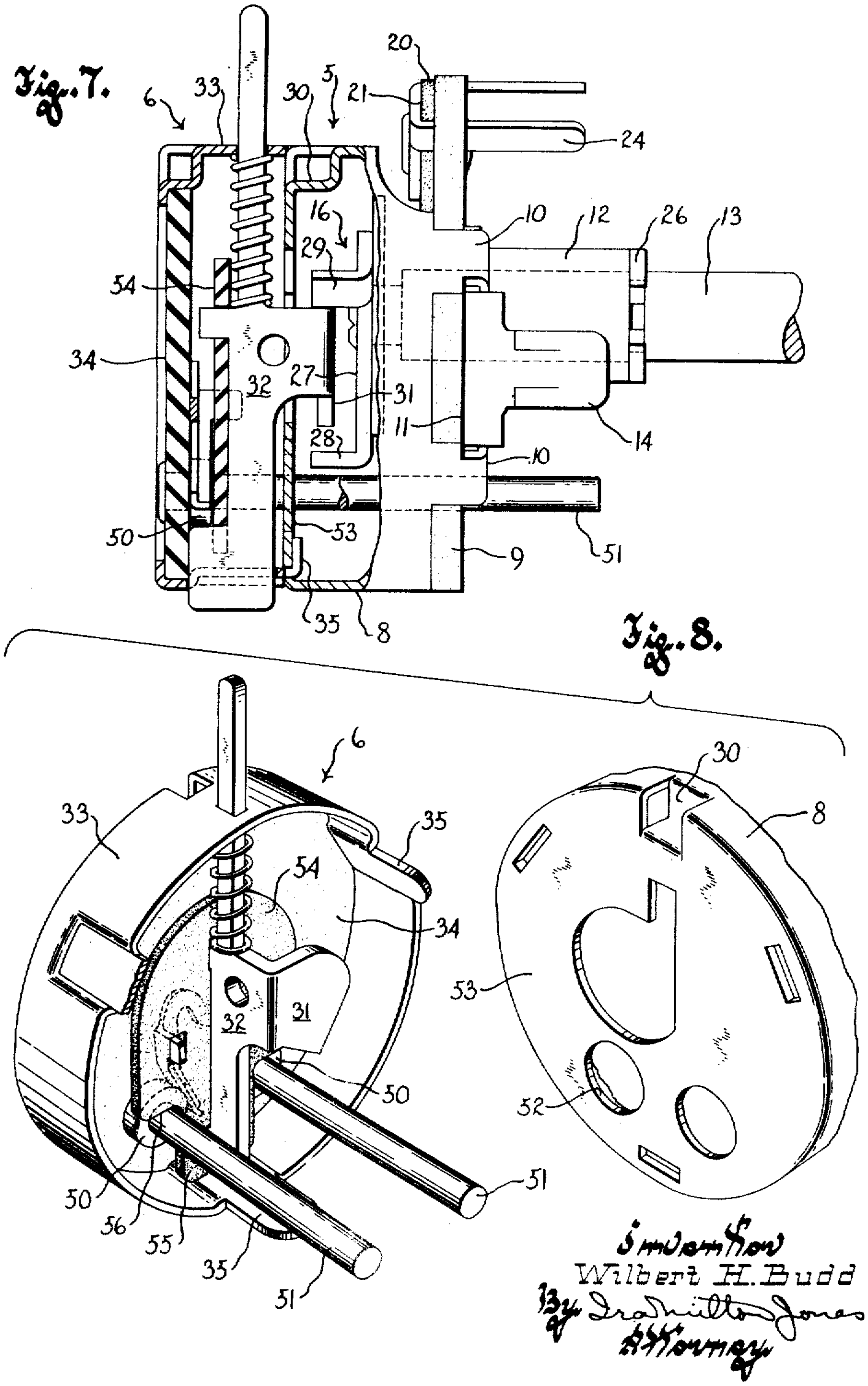
Figure 7 is a view partially in side elevation and partly in longitudinal section of a combined switch and volume control illustrating a modified embodiment of the invention.
Figure 8 is a perspective view illustrating the interior of the switch shown in Figure 7 and the back wall of the housing or casing for the volume control and upon which the switch is mounted in use.

In the drawings, in Figures 1 and 7, the reference characters 28 and 29 should be considered as interchanged; in Figure 1, the vertical portion of the line 2-2 denoting the planes upon which the cross sectional view Figure 2 is taken, should be considered as lying between the cam 31 and the drive arm 27.

Signed and sealed this 23rd day of December 1958.

(SEAL)
Attest:

KARL H. AXLINE
Attesting Officer

ROBERT C. WATSON
Commissioner of Patents